(12) United States Patent
Lu

(10) Patent No.: US 7,670,726 B2
(45) Date of Patent: Mar. 2, 2010

(54) OPTICAL DIFFUSERS, PHOTOMASKS AND THEIR METHODS OF FABRICATION

(76) Inventor: Zhijian Lu, 23 MCelroy La., Belle Mead, NJ (US) 08502

(*) Notice: Subject to any disclaimer, the term of this patent is extended or adjusted under 35 U.S.C. 154(b) by 520 days.

(21) Appl. No.: 11/489,715

(22) Filed: Jul. 20, 2006

(65) Prior Publication Data

US 2008/0020291 A1    Jan. 24, 2008

(51) Int. Cl.
*G03F 1/00* (2006.01)
(52) U.S. Cl. ............................................. 430/5; 716/19
(58) Field of Classification Search ................ 430/5, 430/311, 321, 394, 396; 716/19, 21
See application file for complete search history.

(56) References Cited

U.S. PATENT DOCUMENTS

| | | | |
|---|---|---|---|
| 5,521,726 A | | 5/1996 | Zimmerman |
| 5,538,817 A * | | 7/1996 | Smith et al. ................... 430/5 |
| 6,159,642 A * | | 12/2000 | Kawano et al. ................ 430/5 |
| 6,291,146 B1 | | 9/2001 | Chang et al. |
| 6,303,276 B1 | | 10/2001 | Savant et al. |
| 7,037,573 B2 | | 5/2006 | Miyatake |
| 2004/0009413 A1* | | 1/2004 | Lizotte .......................... 430/5 |
| 2005/0118516 A1* | | 6/2005 | Okumura et al. ............... 430/5 |
| 2006/0048091 A1* | | 3/2006 | Joshi et al. .................... 716/21 |

* cited by examiner

*Primary Examiner*—Mark F Huff
*Assistant Examiner*—Stewart A Fraser

(57) ABSTRACT

A large mask with random apertures may be formed by forming a smaller mask (also called a cell mask) with a random pattern of transmissive apertures which is then repeatedly replicated to create the large mask. The random pattern may be created by perturbing the aperture locations by a small amount or the apertures may be randomly placed within the cell mask provided certain criteria are met. Alternatively, a large mask with a random pattern of transmissive apertures may be formed without using a cell mask. This large mask may be used to fabricate diffusers and other devices that do not suffer from the interference, diffraction and other optical effects common in devices having structures that are non-randomly patterned.

19 Claims, 14 Drawing Sheets

OPTICAL DIFFUSERS, PHOTOMASKS AND THEIR METHODS OF FABRICATION

FIELD OF THE INVENTION

The present invention relates generally to optical diffusers, photomasks and their methods of manufacture, and more particularly, optical diffusers with randomly placed structures, photomasks with randomly placed apertures, and their methods of manufacture.

BACKGROUND

Photomasks may be used to fabricate optical diffusers and numerous other optical devices. Typically, most masks have apertures that are regular and very well ordered. However, the resultant optical devices often suffer from diffractive, interference, or other optical effects due to the features produced by the mask being regular and very well ordered. Accordingly, there is a strong need in the art for devices and masks that address these problems.

SUMMARY OF THE INVENTION

An aspect of the present invention is to provide a photomask including a mask having a plurality of areas. Each of the plurality of areas has a substantially identical pattern of transmissive apertures that are randomly located.

Another aspect of the present invention is to provide method of fabricating a photomask including selecting a transmissive apertures pattern by randomly generating transmissive apertures positions and forming the transmissive apertures pattern in a plurality of areas of a mask.

Another aspect of the present invention is to provide an optical device including a device having at least one area with randomly located device structures on a substrate, each of the randomly located device structures has a bottom and a top. The bottom is between the top and the substrate, and cross-sections adjacent the tops of the randomly located device structures have smaller areas than cross-sections adjacent the bottoms of the randomly located device structures. The randomly located device structures are made from a transmissive polymerizable material.

Another aspect of the present invention is to provide a method of forming an optical device including selecting a transmissive apertures pattern by randomly generating transmissive apertures positions, and forming the transmissive apertures pattern in at least one area of a mask, providing a layer of photopolymerizable material on a substrate, illuminating the mask with light to selectively photopolymerize the layer of photopolymerizable material, and removing photopolymerizable material left unpolymerized after the illuminating the mask with light such that the at least one area includes randomly located device structures on the substrate. Each of the randomly located device structures has a bottom and a top, and the bottom is between the top and the substrate. Cross-sections adjacent the tops of the randomly located device structures have smaller areas than cross-sections adjacent the bottoms of the randomly located device structures. The photopolymerizable material is transmissive after polymerization.

BRIEF DESCRIPTION OF THE DRAWINGS

The invention will be described in detail with reference to the following drawings in which like reference numerals refer to like elements wherein.

DETAILED DESCRIPTION

Figure 1:
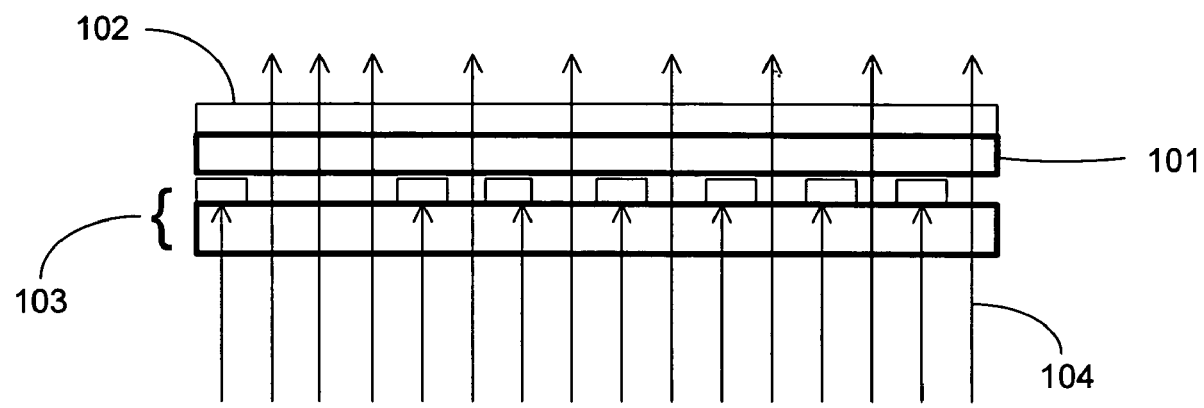
FIG. 1 illustrates irradiation of a mixture of materials to form randomly located structures.

Optical devices, such as diffusers, fabricated with features that are not regular and very well ordered do not suffer from diffractive, interference, or other optical effects that impair their function as is typical when those features are regular and very well ordered. One way to do this is to make the placement of the feature either not regular or not very well ordered or both. A first way to accomplish this is to start with a regular design and then randomly perturb the placement of the features. A second way to accomplish this is to randomly place the features. A third way is to accomplish this is to generate a small area as described in the first or second ways and then replicate that small area. For example, a large mask with random apertures may be formed by forming a smaller mask (also called a cell mask) with a random pattern of transmissive apertures which is then repeatedly replicated in an XY step and repeat pattern to create the large mask. This large mask may be used to fabricate diffusers and other devices that do not suffer from the interference and diffraction effects common in devices having structures that are non-randomly patterned. Furthermore, the large mask appears macroscopically uniform because the same random pattern is uniformly replicated over the area of the large mask and because the boundaries of a cell mask are checked with an algorithm to ensure that suitable separation between transmissive apertures will be maintained when the cell mask is replicated.

The design process of a large mask begins with the selection of the cell mask size. This step may be skipped when the cell mask and the large mask are the same size. The cell mask must be large enough to prevent the appearance of a pattern in the large mask that can occur because the apertures inside a cell mask are random and thus not absolutely uniform. Thus, when the small cell mask is repeatedly replicated to cover the large mask area, the slight nonuniformities in the placement of the apertures of the cell mask that are not apparent can become apparent in the large mask as some sort of pattern. It is this pattern in the large mask that can prevent the large mask from looking macroscopically uniform. To avoid the appearance of this pattern in the large mask, the cell mask size may be increased. Unfortunately, the design time and computer capacity also increases as the cell size increases. Accordingly, it has been found that cell mask sizes between 2 mm×2 mm and 20 mm×20 mm result in acceptable spatial uniformity in the large mask and may be designed with most personal or notebook computers in a reasonable amount of time. Alternatively, a cell mask can have a shape other than square.

Next, the shape, size and number of apertures in a cell mask are selected. Circular apertures generally result in an azimuthally symmetric distribution of the optical devices made with the mask. Other shapes of aperture may also be used. The size of the apertures is mainly determined by the desired device performance and device fabrication processes. For example, the size of apertures in a cell mask may range from 5 μm to 250 μm diameters with circular apertures. The number of apertures in a mask for a given shape and size (density) is one of the design parameters to determine the angular distribution. The higher the number of apertures that do not overlap, the greater the scattering of light with diffusers, hence a wider angular distribution. In some of the randomization methods detailed below, a minimum number of apertures may be defined instead of a set number.

Next, a method of randomization is selected. One method is to use a non-randomly patterned aperture arrangement and perturb the locations randomly from the non-randomly patterned aperture arrangement locations by a random amount that has some predetermined maximum amount. The maximum perturbation distance may be determined by the size of the apertures, the distance between aperture center prior being perturbed, and the allowable amount of overlapping of apertures or the minimum separation between apertures. The perturbation distance may have some minimum amount although this is not required. The direction of perturbation may be in any random direction or may be in any other suitable pattern.

A second method of randomization is to randomly place the centers of the apertures in the cell mask and make sure that there is at least a certain amount of separation between the aperture centers. Aperture centers that do not have the desired separation are not included and another random choice is made. The random choices are made until the cell mask has the specified number of apertures. Since the larger mask that will be formed by a matrix of cell mask aperture patterns, the opposing boundaries (e.g., top/bottom, right/left) are checked for the desired separation through an algorithm. This opposing boundary check is made to ensure the macroscopic uniformity. Otherwise, the large mask and/or the device fabricated by the large mask may appear to have a grid pattern. The amount of separation may be such that apertures cannot overlap each other or the amount of separation may be such that the apertures may overlap each other. The amount of separation needed to have distinctive structures formed during device fabrication depends on the size of the apertures and the particulars (e.g., collimation angle) of the UV system or other suitable system used to fabricate the device. The amount of light dispersion in diffusers increases as the number per unit area (density) of distinctive structures increases. When two structures overlap, they form a single distinctive structure of larger size. Thus overlapping effectively reduces the density which allows more light transmission in the normal direction and less being dispersed at non-normal angles.

Alternatively, the apertures may include one or more types of apertures. For example, the apertures may be circular, elliptical, rectangular, pentagonal, hexagonal, octagonal, combinations of these shapes or any other desired shape The orientation of a non-circular aperture may be determined randomly. If different types of apertures are used, the number of each may be random. Also, the cell mask may allow for wrapping of apertures from one border to the opposing border. In other words, if an aperture is partly cut off due to the aperture being too close to the edge of the cell mask, that remaining part of that aperture is formed at the opposing border such that when the cell mask is used to form the larger mask, complete apertures are formed by two adjacent cell masks.

Any suitable method may be used to fabricate a device with a mask according to the present invention. For example, one exemplary method of fabricating a diffuser with a mask with random aperture locations begins with preparing a mixture of materials. The mixture of materials includes one or more components plus a photoinitiator or photoinitiators. Alternatively, the photoinitiator may be omitted if a photopolymerizable material is used that does not require a photoinitiator. The mixture also may contain one or more non-photopolymerizable material components such as solid particles, liquids, colloids, gases (e.g., air or nitrogen) or other useful components. The mixture should be uniform prior to photopolymerization. Next, as illustrated in FIG. 1, a carrier film 101 (which may also be called a substrate), such as a PET film, a PMMA film, a PVA film or any other suitable film, is placed upon a photomask 103. The photomask 103 may have any suitable random configuration. Additionally, an index matching fluid, such as isoproponol alcohol, may be applied between carrier film 101 and the photomask 103. Next, a layer 102 of the mixture of materials is coated onto the carrier film 101 through doctor blade coating, slot die coating, or any other suitable coating techniques. The thickness of the layer 102 may be between about 5 μm (0.2 mil) and about 508 μm (20 mils) with about 50.8 μm (2 mils) and about 254 μm (10 mils) being typical.

Next, as is illustrated in FIG. 1, a collimated or nearly collimated UV or visible light 104 passes through the transparent apertures of the photomask 103 and selectively polymerizes the layer 102. The collimated or nearly collimated UV or visible light 104 causes polymerization and the formation of a solid structure. When phase separating materials are used, a first material of the layer 102 polymerizes to form the solid structure while a second material (which is substantially different from the first material of the layer 102) phase separates from the first material during the irradiation of the collimated or nearly collimated UV or visible light 104. The second material may be unpolymerizable material or material that does not polymerize from the collimated or nearly collimated UV or visible light 104. For example, the second material could be a thermally polymerizable material (e.g., a thermopolymer) or any other polymerizable material that does not polymerize as a result of irradiation of the collimated or nearly collimated UV or visible light 104. If the second material is polymerizable, this material may be polymerized after the removal of the unexposed areas of the layer 102. The second material also may be a polymerizable material that polymerizes from the irradiation of UV or visible light. For example, the second material may polymerize at the same or a substantially different rate from that of the first material under the irradiation of UV or visible light and is incompatible with first material after polymerization. The resultant structures, particularly the sides and/or tops are typically rough when phase separating materials are used and are typically smooth when non-phase separating materials or single component materials are used.

The mixture used in the layer 102 may include additional materials. For example, the first material could be a combination of two or more materials and/or the second material could be a combination of two or more materials. Also there could be two or more photoinitiators, or there could be other materials such as a dye or pigment material in the mixture. Furthermore, the mixture may be limited to inexpensive materials as opposed to expensive materials (e.g., liquid crystal materials).

Next the selectively polymerized layer 102 is washed with solvent (e.g., methanol, acetone, water, isopropanol or any other suitable solvent or solvents) such that unexposed areas of the layer 102 are removed. Additionally, with phase separating materials, the second material in the exposed areas of the layer 102 that are located at a boundary between an exposed area and an unexposed area are also removed because it is not fully surrounded by polymerized first material. This creates a light diffusing device structure 206 with rugged pitted surfaces instead of smooth surfaces on the facets of the device structure 206. Further examples of such diffusers may be found in U.S. patent application Ser. No. 11/439,437, which is incorporated herein in its entirety by this reference. A plurality of these structures 206 forms an excellent diffuser having a wide range of light diffusion angles. Similarly structured diffusers may be fabricated using other fabrication methods. Such similarly structured diffusers may be made from phase separated materials, may be made from non-phase separated materials or may be a single material.

The device structure 206 formed with phase separating materials has rugged pitted surfaces that provide multiple light scattering facets on each structure 206. Some of these light scattering facets are parallel facets 202 while others are inclined facets 204. The parallel facets 202, which may be points, are generally parallel to the carrier film 101 while the inclined facets 204 form an angle with carrier film 101 between 0 and 90 degrees. However, the random nature and small size of phase separation helps ensure a wide variation of facets which in turn helps ensure a wide angle of light distribution. Additionally, by controlling the relative amounts of the first and second material in the mixture, the relative amount of photoinitiator and/or the irradiation of the layer 102, the character (e.g., size, density, shape) of the surfaces of the structure 206 may be selected. The ability to determine the character of the surfaces allows one to select the angular light distribution characteristics of the resultant structures 206.

Figure 3:
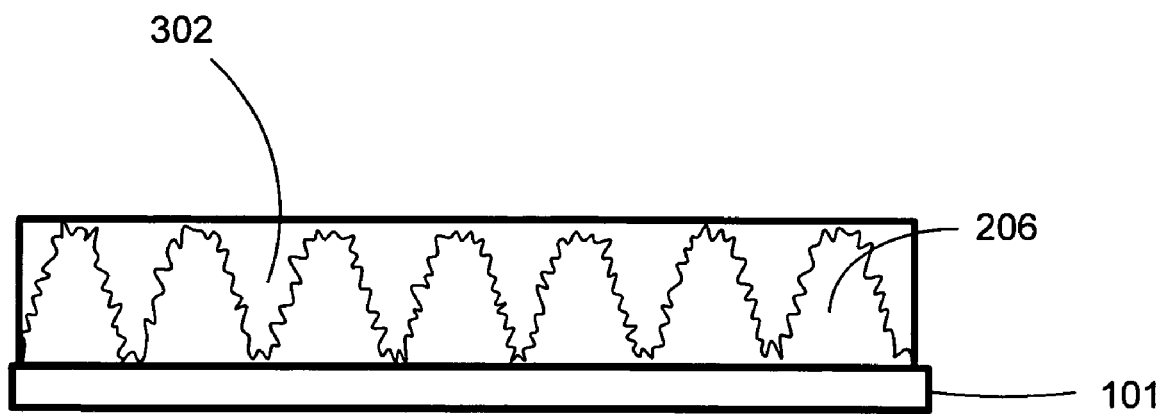
FIG. 3 illustrates another exemplary diffuser that includes structures having a substantially light transmitting material overcoat.

FIG. 3 illustrates another exemplary diffuser 300 that includes structures 206 having a substantially light transmitting material overcoat 302. The substantially light transmitting material overcoat 302 has a different refractive index from the refractive index of the structures 206. The greater the difference in refractive index, the wider the angular distribution of light. Typically, the refractive index difference is greater than about 0.005, with the refractive index difference often being greater than about 0.01. For example, the structures 206 may be made from a mixture of ethoxylated (3) bisphenol A diacrylate and polythylene glycol(600) diacrylate and have an averaged refractive index of 1.52. The substantially light transmitting material overcoat 302 may have a smaller refractive index (e.g., silicone, fluorinated acrylates or methacrylates, fluoro epoxies, fluorosilicones, or other such materials) or may have a larger refractive index (e.g., polysulfone, polyphenylsulfone, polyethersulfone, or any other suitable materials).

Figure 4:
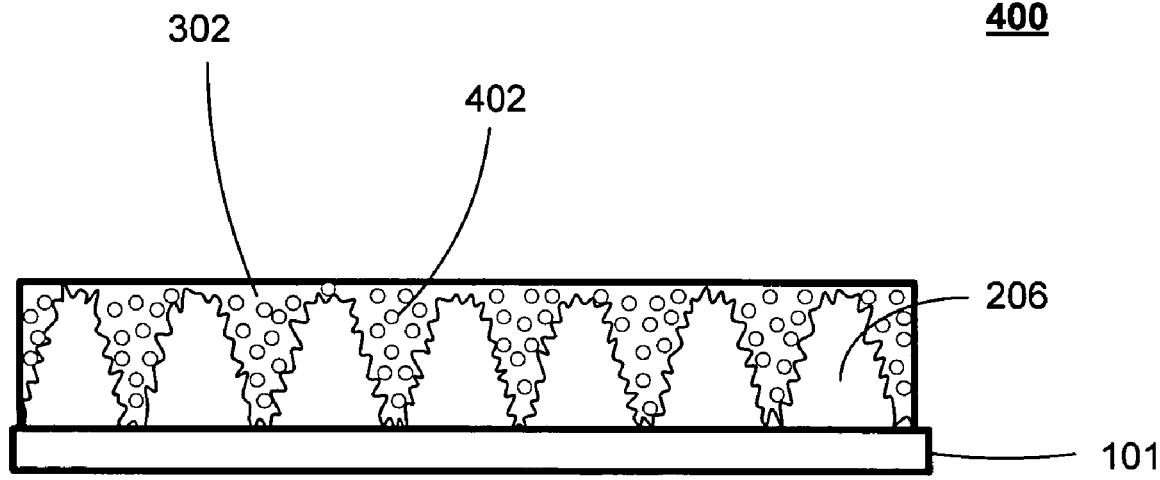
FIG. 4 illustrates another exemplary diffuser similar to the diffuser of FIG. 3 except that the substantially light transmitting material overcoat also includes scattering particles.

FIG. 4 illustrates another exemplary diffuser 400 similar to the diffuser 300 of FIG. 3 except that the diffuser 400 also includes scattering particles 402 in the substantially light transmitting material overcoat 302. The scattering particles 402 may be glass beads, polymer (e.g., polystyrenes, acrylics, polycarbonates, olefins, or other optically clear polymer materials) particles, or particles of any other suitable material.

Figure 5:
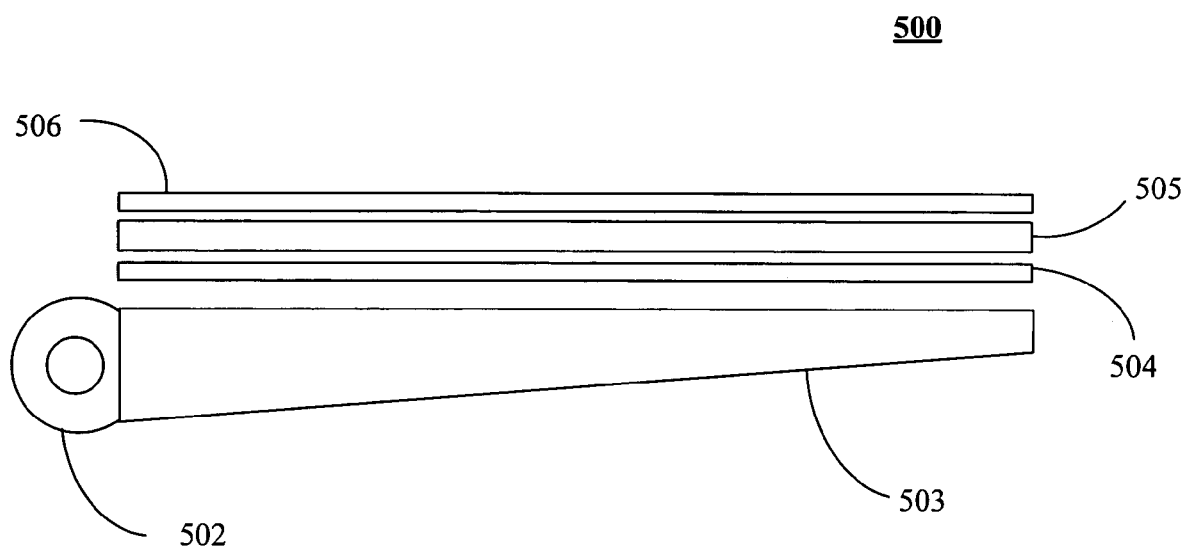
FIG. 5 illustrates an exemplary liquid crystal display backlight including a diffuser according to the present invention.

The present invention may be incorporated into various kinds of light sources and other devices. For example, FIG. 5 illustrates an exemplary liquid crystal backlight (LCD backlight) 500 including a diffuser according to the present invention. A light source 502 emits light along an edge of an optical waveguide plate 503. The light source 502 may be cold cathode fluorescent lamps, light emitting diodes or any other light source. The light from the light source 502 is coupled into the waveguide plate 503 and directed upwards by the waveguide plate 503. The redirection of the light in the waveguide plate may be performed by structured bottom surface of the waveguide plate 503, by printed scattering dots on a bottom surface of the waveguide plate 503 or by any other means. Light coming out from a top surface of the waveguide plate 503 typically lacks sufficient uniformity and has an undesired angular distribution. Thus, diffusers and/or other optical elements are used to improve the uniformity and reshape the angular distribution of the light. For example, a first optical diffuser 504, a second optical diffuser 506, and an optical film 505 may be used. The optical film 505 is used to further redirect light and may be a brightness enhancement film from 3M, the optical film described in U.S. Patent Application Ser. No. 60/677,837, which is incorporated herein by this reference, or any other suitable film. Either one or both of the first and second diffusers 504, 506 may be a diffuser according to the present invention. Alternative numbers and types of films may be combined with one or more diffusers according to the present invention. Alternately, one or more diffusers may be used without any additional films.

Figure 5A:
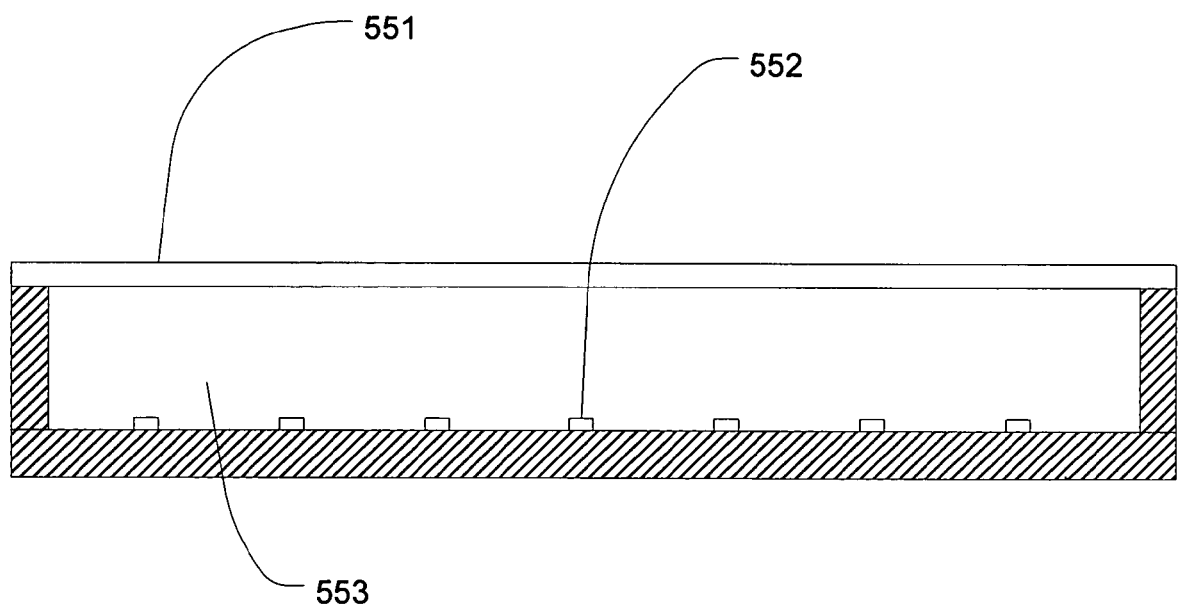
FIG. 5A illustrates another exemplary liquid crystal display backlight including a diffuser according to the present invention.

FIG. 5A illustrates another exemplary liquid crystal backlight (LCD backlight) 550 including a diffuser 551 according to the present invention. The LCD backlight 550 includes light sources 552 which may be an array of light emitting diodes (LEDs), cold cathode fluorescent light (CCFL) tubes or any other suitable light source which is located in a cavity 553 of the LCD backlight 550. A LED is generally a point light source and CCFL tube is generally a linear light source. The spatial distribution of light emitted from an array of LEDs or CCFL tubes is extremely non-uniform. A diffuser 551 according to present invention homogenizes the light emitted from an array of light sources 552 and makes the light spatially uniform. Such an arrangement for LCD backlight 550 may also be used for other purposes, such as general lighting.

Figure 6:
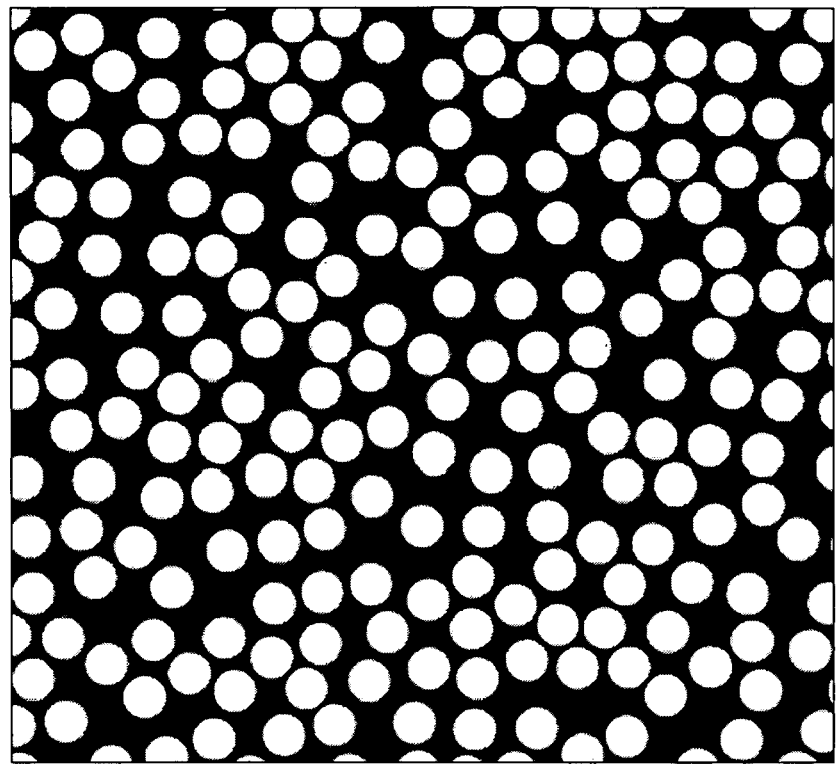
FIG. 6 shows a photograph of a random pattern of circular apertures of a portion of a cell mask that do not overlap.

FIG. 6 is a photograph of a random pattern of circular apertures of a portion of a cell mask that do not overlap. The transparent circular apertures are separated by a minimum of 4.2 μm between adjacent circle peripheries and the diameter of the transparent circular apertures is 30.4 μm.

Figure 7:
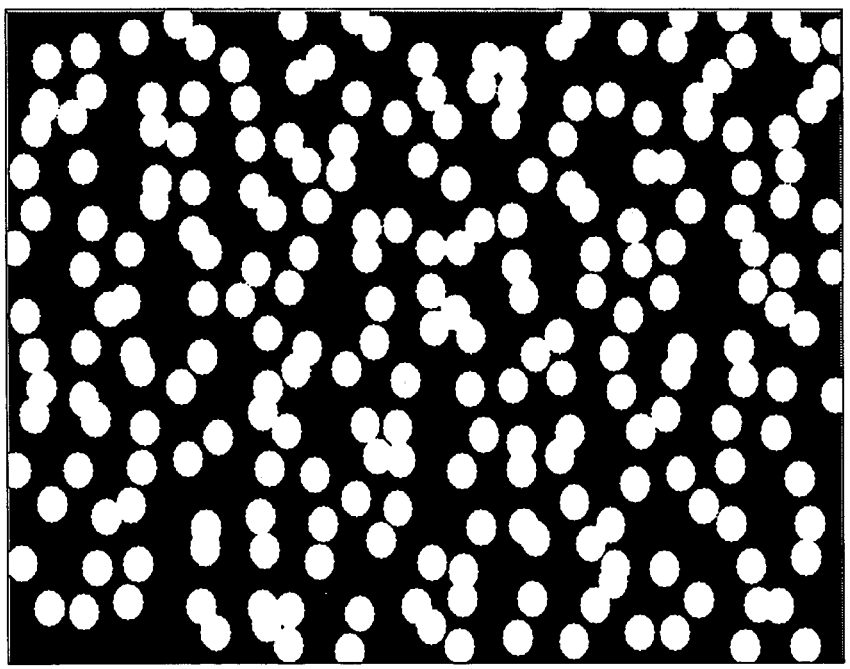
FIG. 7 shows a photograph of a random pattern of circular apertures of a portion of a cell mask that are allowed to overlap.

FIG. 7 is a photograph of a random pattern of circular apertures of portion of a cell mask that are allowed to overlap. The centers of adjacent transparent circular apertures are separated by greater than 7.5 μm and the diameter of the transparent circular apertures is 28.1 μm.

Figure 8:
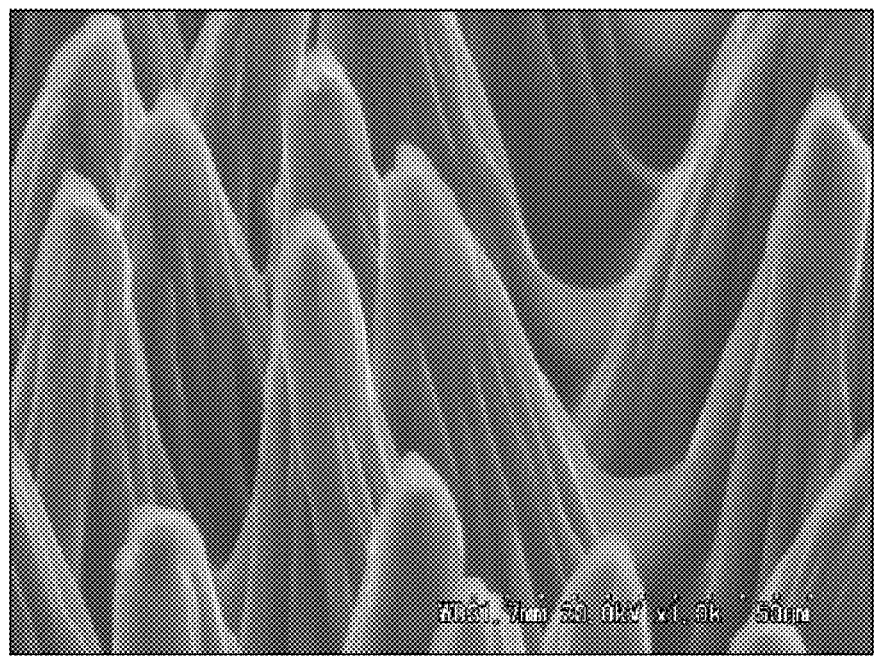
FIG. 8 shows a side view produced by a scanning electron microscope of a diffuser fabricated according to example 1.
Figure 9:
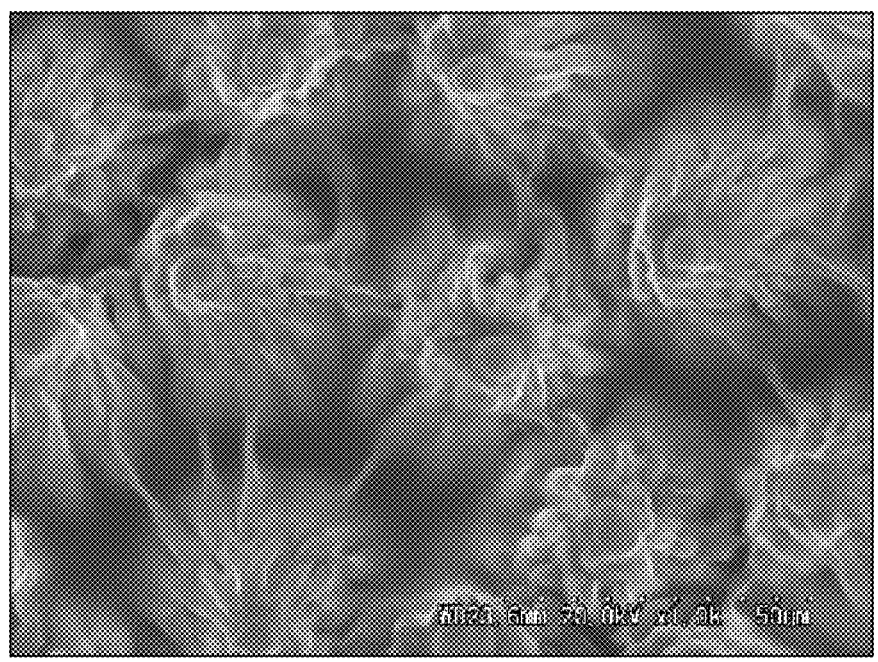
FIG. 9 shows a top view produced by a scanning electron microscope fabricated according to example 1.
Figure 10:
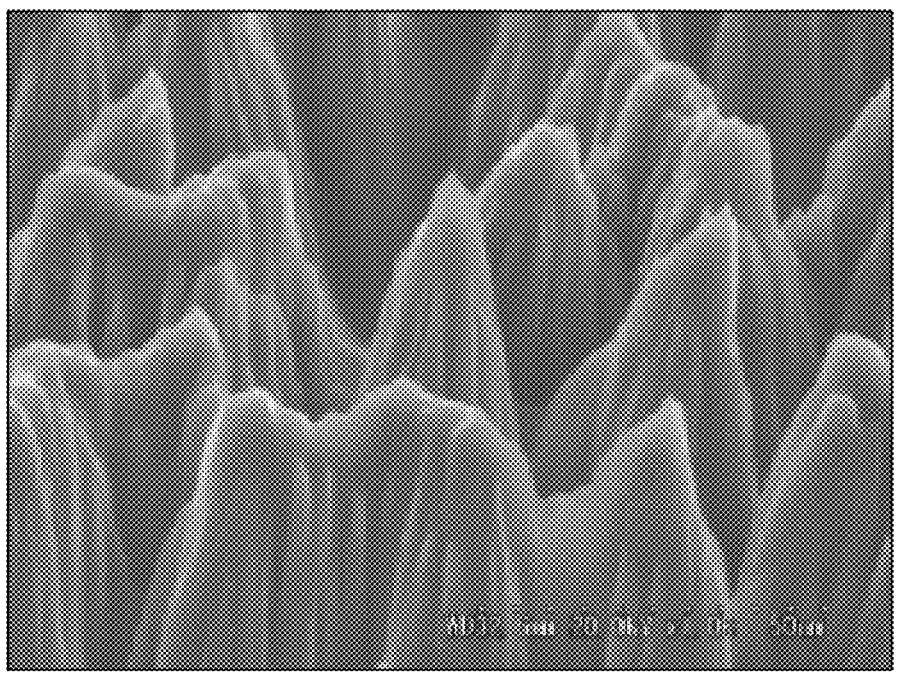
FIG. 10 shows a side view produced by a scanning electron microscope of a diffuser fabricated according to example 2.
Figure 11:
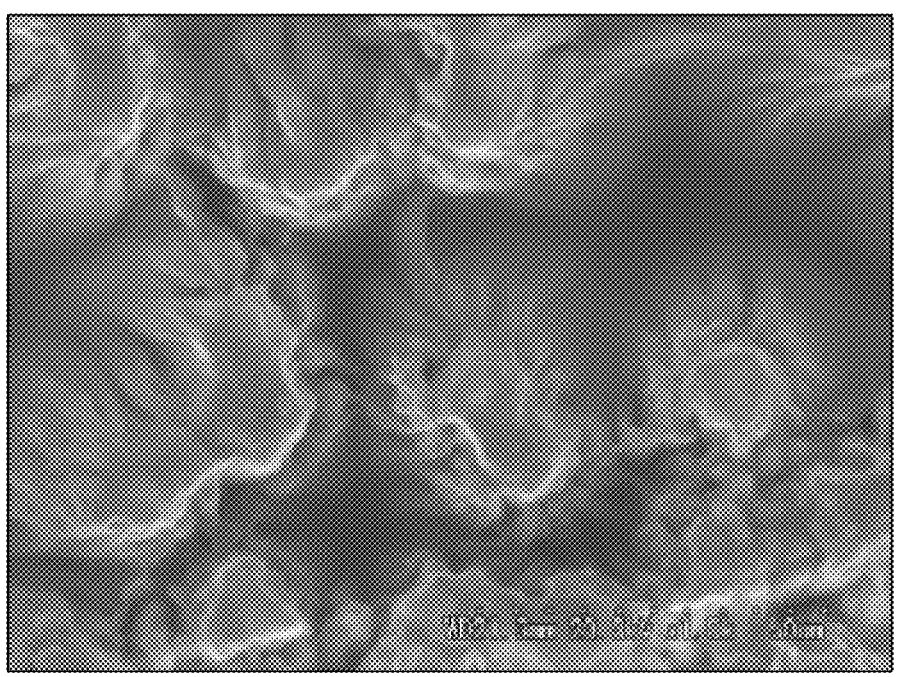
FIG. 11 shows a top view produced by a scanning electron microscope fabricated according to example 2.
Figure 12:
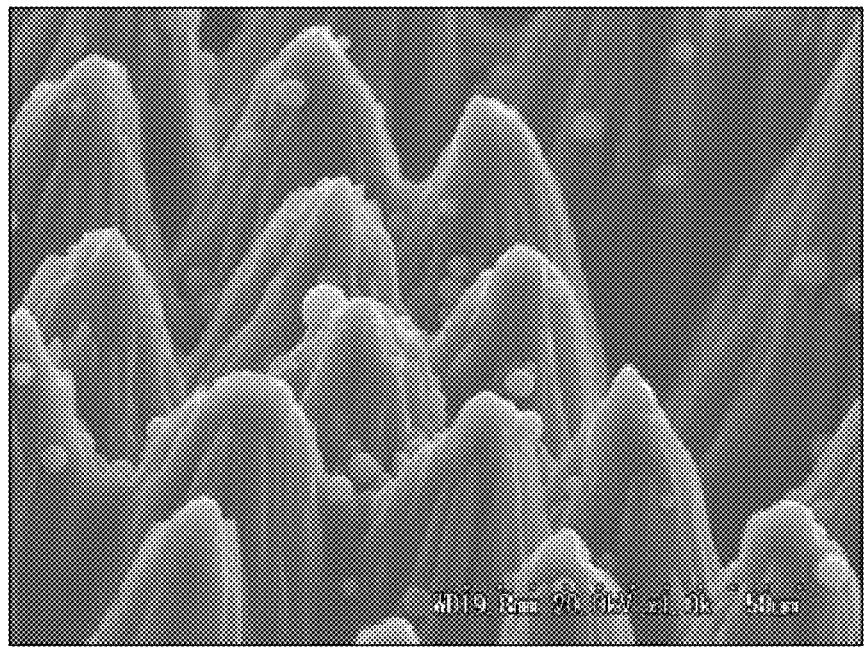
FIG. 12 shows a side view produced by a scanning electron microscope of a diffuser fabricated according to example 3.
Figure 13:
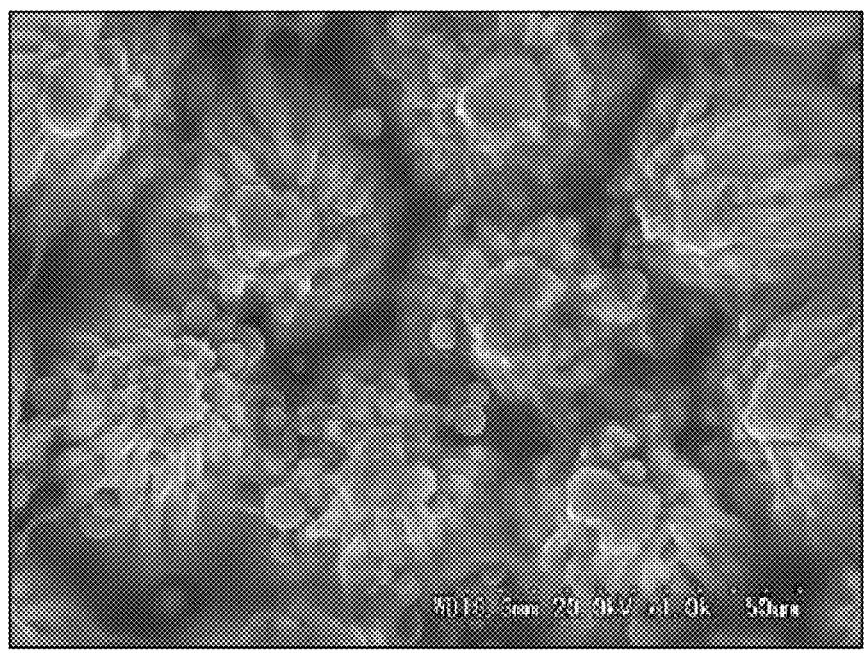
FIG. 13 shows a top view produced by a scanning electron microscope fabricated according to example 3.
Figure 14:
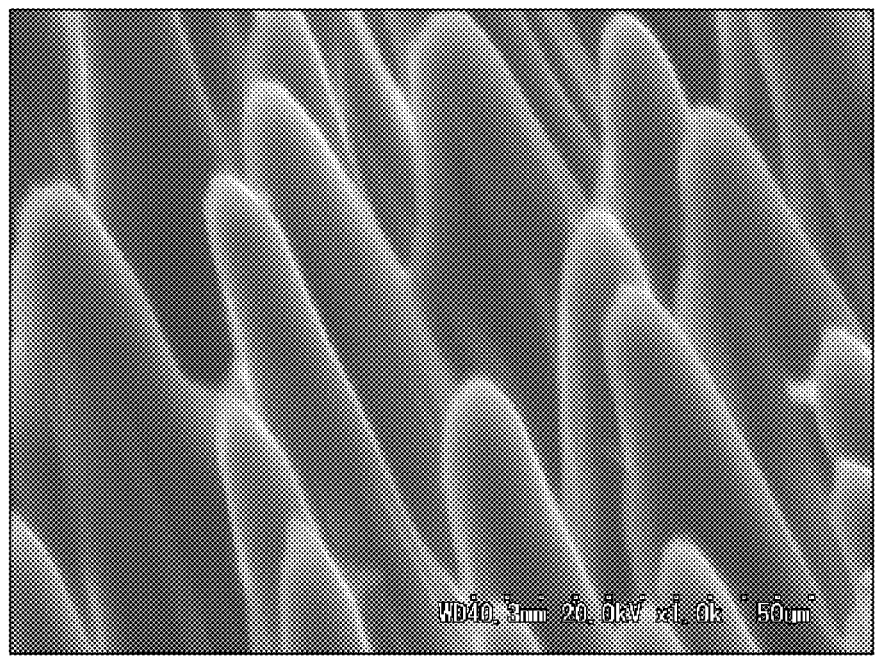
FIG. 14 shows a side view produced by a scanning electron microscope of a diffuser fabricated according to example 4.
Figure 15:
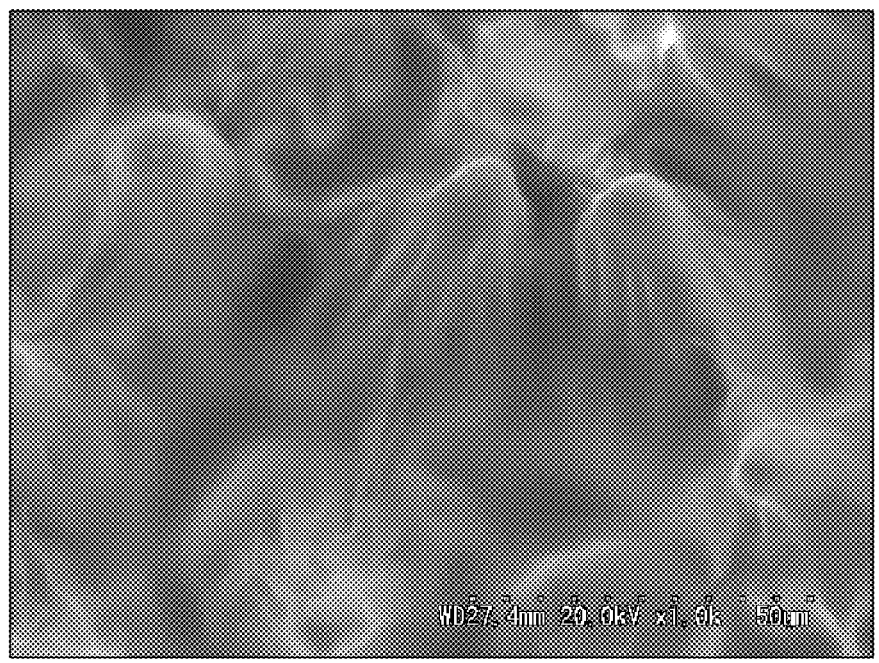
FIG. 15 shows a top view produced by a scanning electron microscope fabricated according to example 4.
Figure 16:
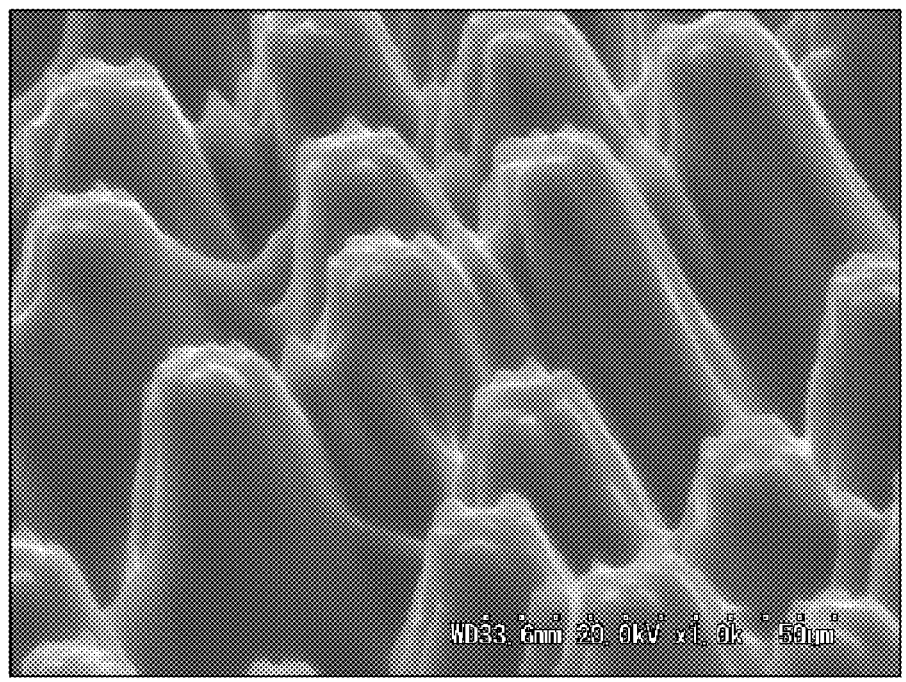
FIG. 16 shows a side view produced by a scanning electron microscope of a diffuser fabricated according to example 5.
Figure 17:
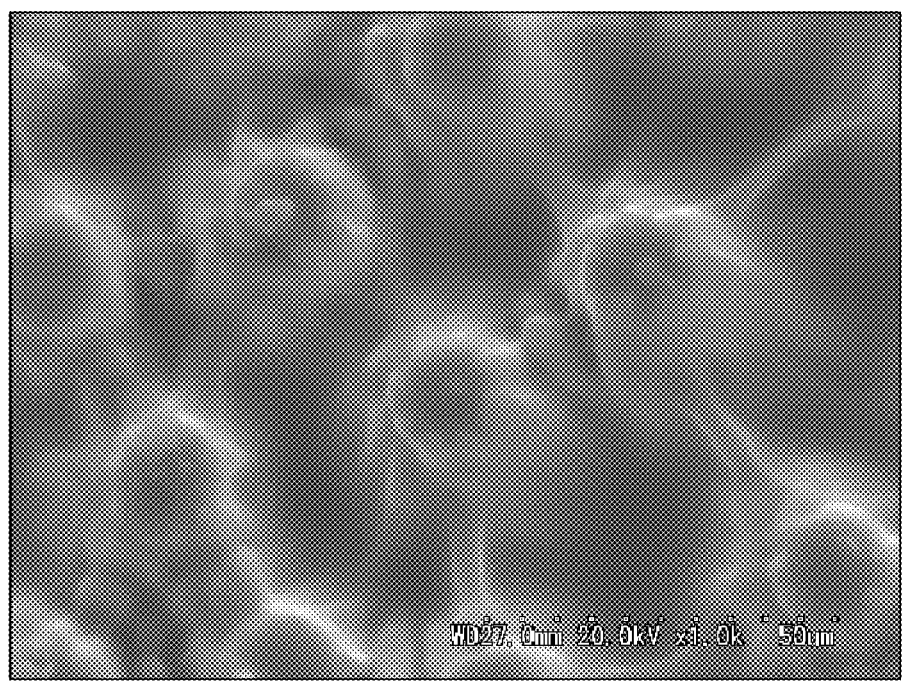
FIG. 17 shows a top view produced by a scanning electron microscope fabricated according to example 5.
Figure 18:
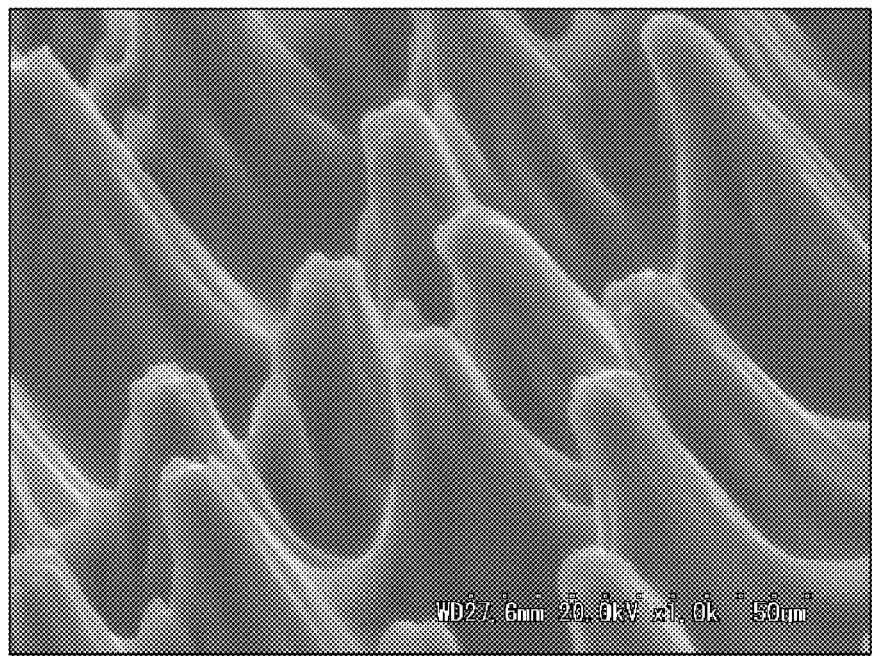
FIG. 18 shows a side view produced by a scanning electron microscope of a diffuser fabricated according to example 6.
Figure 19:
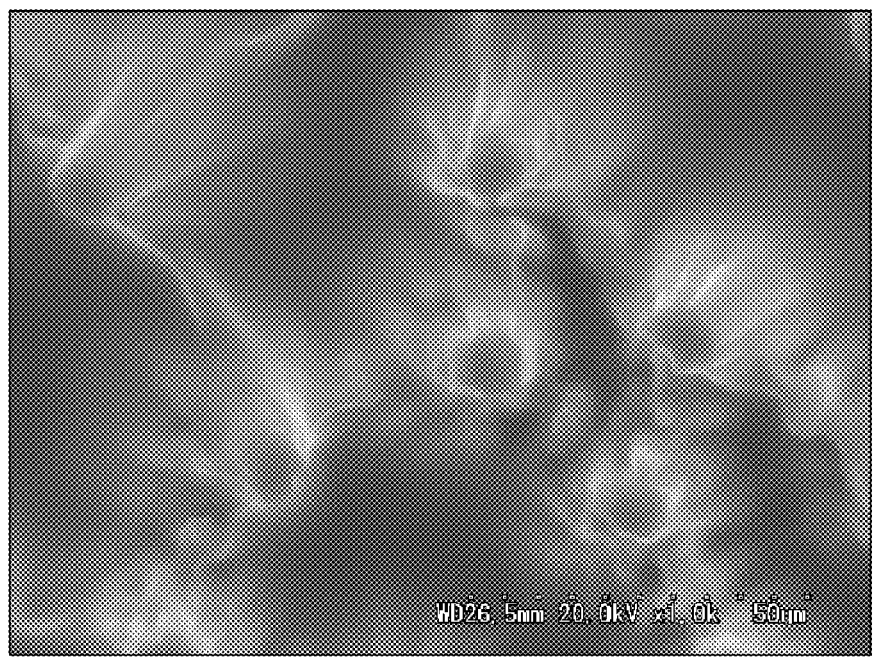
FIG. 19 shows a top view produced by a scanning electron microscope fabricated according to example 6.

FIG. 8 shows a side view produced by a scanning electron microscope of a diffuser fabricated according to example 1. Substantial surface area of the inclined side facets and relatively small surface area of parallel facets of a device structure are evidenced. In fact, the top surface of a device structure is close to a point. As shown in FIG. 8, the surfaces of the facets are rough. FIG. 9 shows a top view produced by a scanning electron microscope fabricated according to example 1. FIG. 10 shows a side view produced by a scanning electron microscope of a diffuser fabricated according to example 2. Part of device structures connect with adjacent device structures, which is a result of small separation of the centers of transparent apertures in photomask. FIG. 11 shows a top view produced by a scanning electron microscope fabricated according to example 2. FIG. 12 shows a side view produced by a scanning electron microscope of a diffuser fabricated according to example 3. The glass beads mixed with the photopolymerized materials are visible when they reside on or very close to the surface of the device structures while the glass beads embedded inside the device structures are not visible. FIG. 13 shows a top view produced by a scanning electron microscope fabricated according to example 3. FIG. 14 shows a side view produced by a scanning electron microscope of a diffuser fabricated according to example 4. These device structures have relatively large inclined surface areas and the surfaces are relative smooth. FIG. 15 shows a top view produced by a scanning electron microscope fabricated according to example 4. FIG. 16 shows a side view produced by a scanning electron microscope of a diffuser fabricated according to example 5. These device structures have larger areas of parallel facets that result in a diffuser having a narrow angular distribution. FIG. 17 shows a top view produced by a scanning electron microscope fabricated according to example 5. FIG. 18 shows a side view produced by a scanning electron microscope of a diffuser fabricated according to example 6. FIG. 19 shows a top view produced by a scanning electron microscope fabricated according to example 6.

As can be seen in FIG. 8 to FIG. 19, the randomly located device structures are substantially linked by the same material forming the device structures. The structures are not fully separated and defined at their bottoms. This linkage helps prevent light leak which improves the performance of the resultant diffusers.

Figure 2:
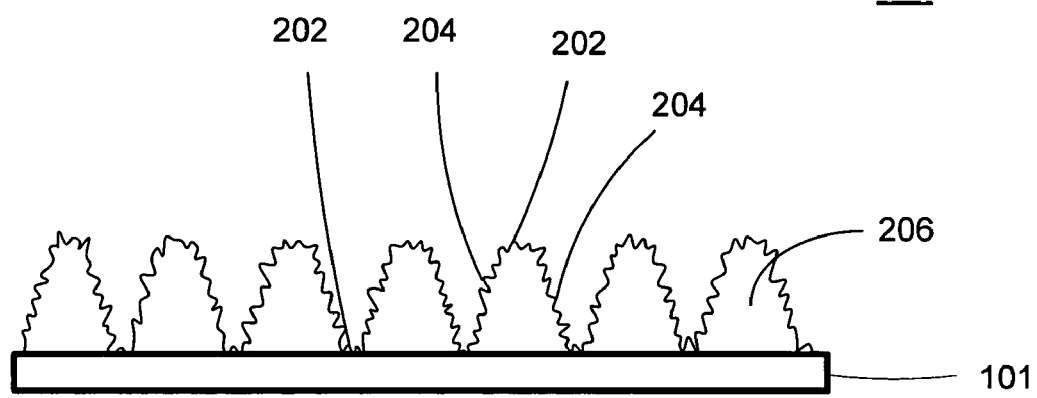
FIG. 2 illustrates an exemplary diffuser according to the present invention.
Figure 20:
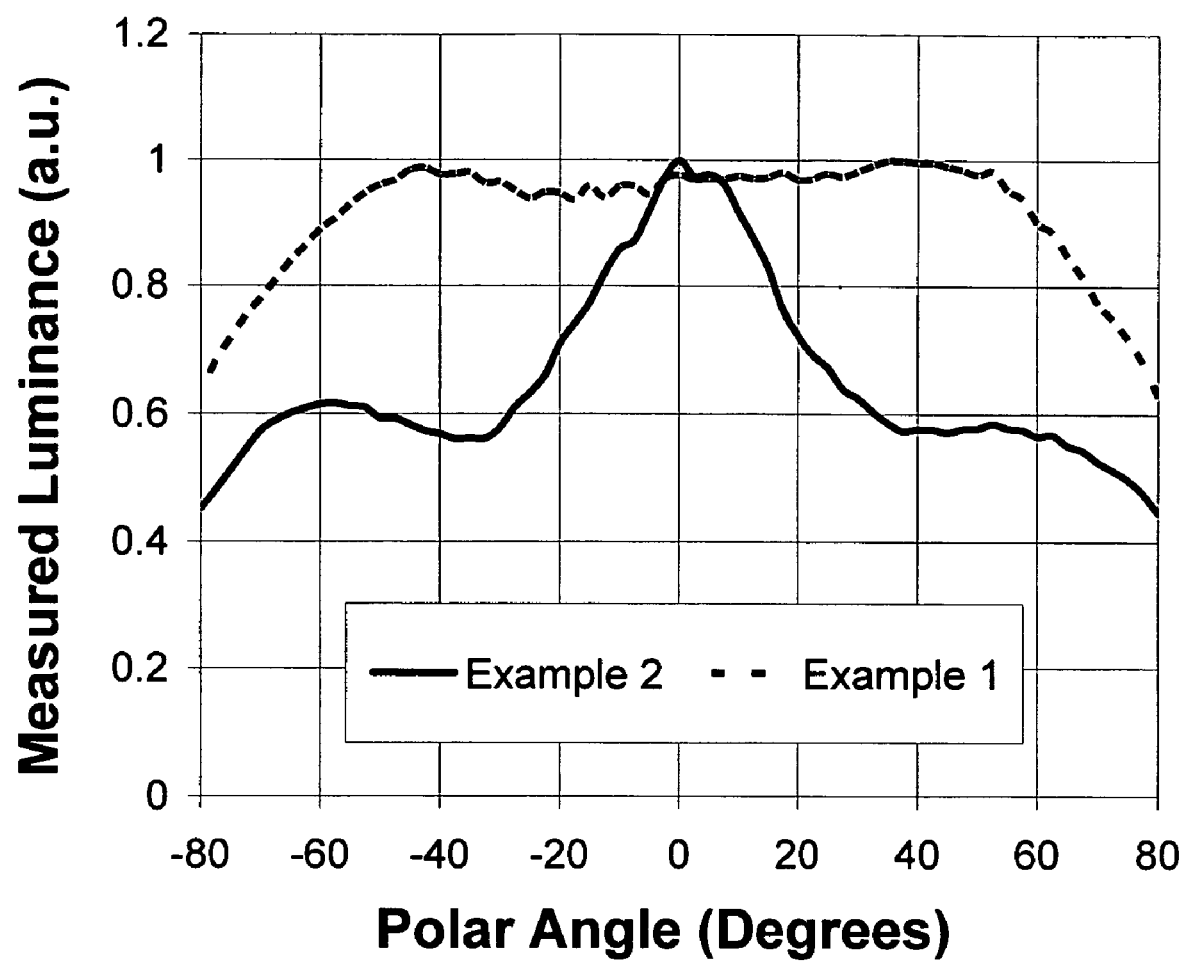
FIG. 20 shows the measured angular distributions of exemplary diffusers with wide FWHM angles fabricated according to examples 1 and 2.

FIG. 20 shows the measured angular distribution of two exemplary diffusers with wide FWHM (Full Width Half Max) angles fabricated according to examples 1 and 2. The vertical axis is normalized luminance and the horizontal axis is the polar angle. The wide angular distribution results from diffuser structures having small surface area of parallel facets 202 and large surface area of inclined facets 204 as illustrated in FIG. 2. Exemplary diffuser structures are shown in FIG. 8 through FIG. 15.

Figure 21:
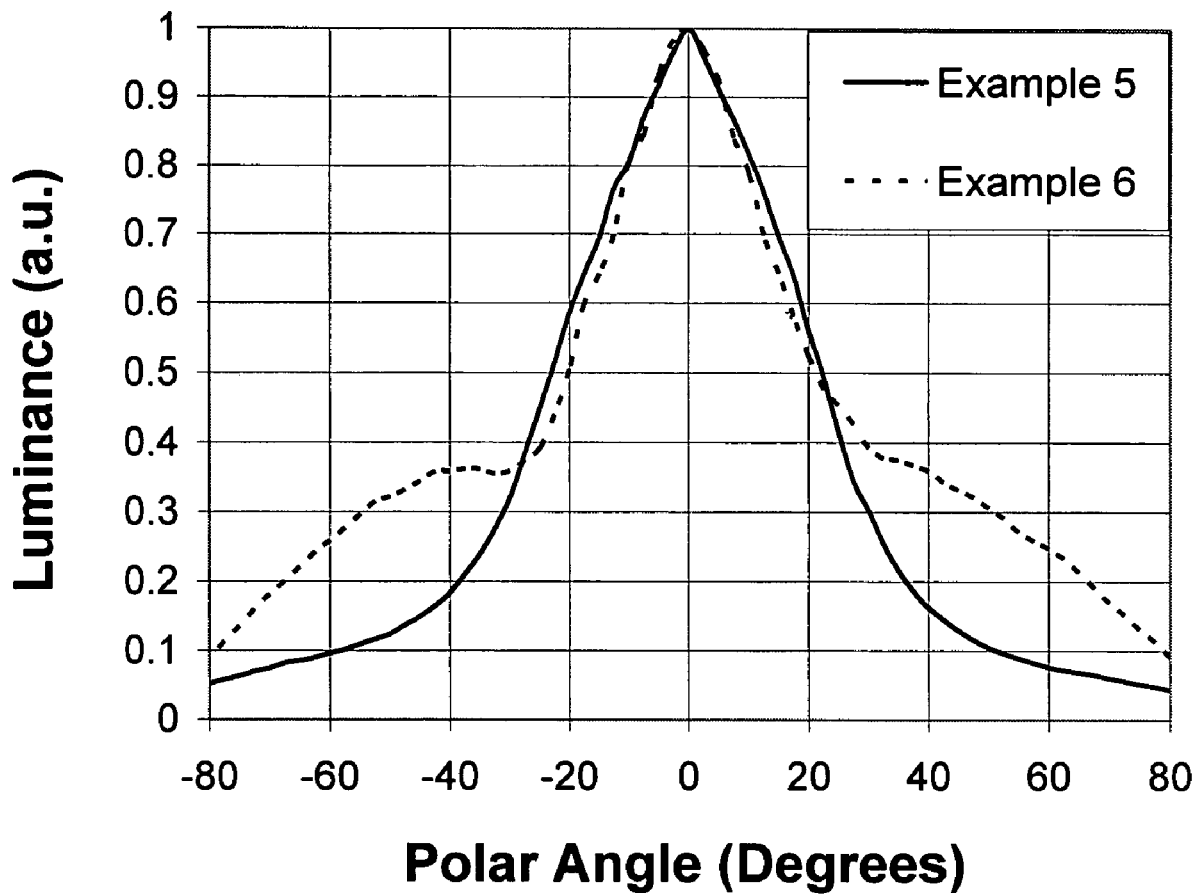
FIG. 21 shows the measured angular distribution of exemplary diffusers with narrower FWHM angles fabricated according to examples 5 and 6.

FIG. 21 shows the measured angular distribution of two exemplary diffusers with narrower FWHM (Full Width Half Max) angles fabricated according to examples 5 and 6. The vertical axis is normalized luminance and the horizontal axis is the polar angle. The angular distribution results from diffuser structures having relatively larger area of parallel facets 202 as illustrated in FIG. 2.

The data shown in FIG. 20 and FIG. 21 are taken by using an EZContrast 160D ELDIM measurement system from ELDIM S. A., France. Collimated white light incidents onto the diffuser from substrate side and diffused light is collected and analyzed by the ELDIM measurement system.

Figure 22:
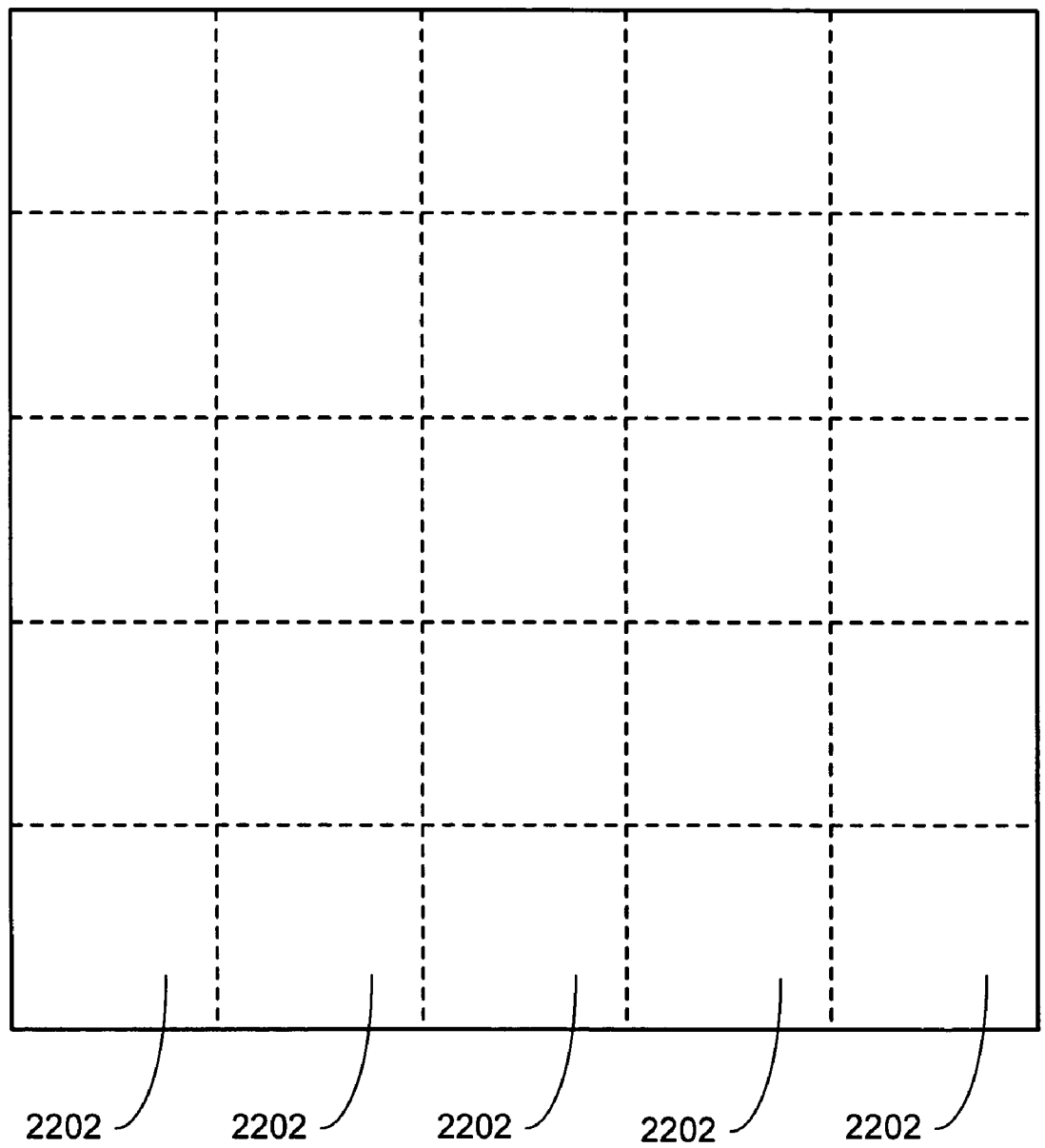
FIG. 22 illustrates a 5 by 5 matrix of cell masks that make up a large mask.

FIG. 22 illustrates a 5 by 5 matrix of cell masks 2202 that make up a fabrication mask 2200. The large mask 2200 may be formed by a step and repeat process (e.g., an XY step and repeat process) with the cell mask 2202 or any other suitable process.

EXAMPLE 1

A mixture containing 15.0 w.t. % of monomer ethoxylated (6) trimethylolpropane triacrylate[1], 19.5 w.t. % of metallic acrylate ester oligomer[1], 44.0 w.t. % of Sartomer low viscosity oligomer[1], 19.5 w.t. % of urethane acrylate oligomer[1], and 2.0 w.t. % of 2,2-dimethoxy-1,2-diphenylethan-1-one[2] was prepared using a compressed air mixer. The mixture was then degassed using ~$10^{-1}$ torr vacuum to remove air bubbles before coating. A PET substrate[3] having a 7 mil thickness was cleaned by blowing it with ionized air. The mixture was coated onto the substrate using a doctor blade to a wet thickness of 8.5 mil (~215 μm). A mask including the pattern of FIG. 6 was placed adjacent the substrate and a UV dosage of 75 mJ/cm$^2$ of ultraviolet light from a metal arc lamp having a collimation angle ~1.5° was used to illuminate the coating through the photomask. The UV exposed coating (with substrate) is then submerged in an agitated methanol bath for about 25 seconds to remove unpolymerized monomer. The substrate and the polymerized monomer are dried by blowing off any remaining solvent. Finally a post cure was performed by irradiating 608 mJ/cm$^2$ of UV dosage.

EXAMPLE 2

A mixture containing 15.0 w.t. % of monomer ethoxylated (6) trimethylolpropane triacrylate[1], 19.5 w.t. % of metallic acrylate ester oligomer[1], 44.0 w.t. % of Sartomer low viscosity oligomer[1], 19.5 w.t. % of urethane acrylate oligomer[1], and 2.0 w.t. % of 2,2-dimethoxy-1,2-diphenylethan-1-one[2] was prepared using compressed air mixer. The mixture was then degassed using ~$10^{-1}$ torr vacuum to remove air bubbles before coating. A PET substrate[3] having a 7 mil thickness was blown with ionized air to clean the PET film. The mixture was coated onto the PET using a doctor blade to a wet thickness of 8.5 mil (~215 μm). A mask including the pattern of FIG. 7 was placed adjacent the substrate and a 75 mJ/cm$^2$ of ultraviolet light from a metal arc lamp having a collimation angle ~1.5° was used to illuminate the coating through the photomask. The UV exposed coating (with substrate) is then submerged in an agitated methanol bath for about 25 seconds to remove unpolymerized monomer. The substrate and the polymerized monomer are dried by blowing off any remaining solvent. Finally a post cure was performed by irradiating 606 mJ/cm$^2$ of UV dosage.

EXAMPLE 3

A mixture containing 44.3 w.t. % of monomer ethoxylated (3) bisphenol A diacrylate[1], 44.3 w.t. % of monomer polythylene glycol(600) diacrylate[1], 8.9 w.t. % of metallic acrylate ester oligomer[1], 0.5% of glass beads (with diameters between 3 to 5 µm) and 2 w.t. % of photoinitiator 2,2-dimethoxy-1,2-diphenylethan-1-one (benzyl dimethyl ketal)[2] was prepared using compressed air mixer. The mixture was then degassed using ~10$^{-1}$ torr vacuum to remove air bubbles before coating. A PET substrate[3] having a 7 mil thickness was blown with ionized air to clean the PET film. The mixture was coated onto the PET using a doctor blade to a wet thickness of 8.5 mil (~215 µm). A mask including the pattern of FIG. 6 was placed adjacent the substrate and a UV dosage of 55 mJ/cm$^2$ of ultraviolet light from a metal arc lamp having a collimation angle ~1.5° was used to illuminate the coating through the photomask. The UV exposed coating (with substrate) is then submerged in an agitated methanol bath for about 25 seconds to remove unpolymerized monomer. The substrate and the polymerized monomer are dried by blowing off any remaining solvent. Finally a post cure was performed by irradiating 607 mJ/cm$^2$ of UV dosage.

EXAMPLE 4

A mixture containing 98 w.t. % of monomer ethoxylated (6) trimethylolpropane triacrylate[1] and 2 w.t. % of photoinitiator 2,2-dimethoxy-1,2-diphenylethan-1-one (benzyl dimethyl ketal)[2] was prepared using compressed air mixer. The mixture was then degassed using ~10$^{-1}$ torr vacuum to remove air bubbles before coating. A PET substrate[3] having a 7 mil thickness was blown with ionized air to clean the PET film. The mixture was coated onto the PET using a doctor blade to a wet thickness of 8.5 mil (~215 µm). A mask including the pattern of FIG. 6 was placed adjacent the substrate and a UV dosage of 75 mJ/cm$^2$ of ultraviolet light from a metal arc lamp having a collimation angle ~1.5° was used to illuminate the coating through the photomask. The UV exposed coating (with substrate) is then submerged in an agitated methanol bath for about 25 seconds to remove unpolymerized monomer. The substrate and the polymerized monomer are dried by blowing off any remaining solvent. Finally a post cure was performed by irradiating 608 mJ/cm$^2$ of UV dosage.

EXAMPLE 5

A mixture containing 89.8 w.t. % of monomer ethoxylated (6) trimethylolpropane triacrylate[1] and 9.0 w.t. % of difunctional amine coinitiator[1], 0.3 w.t. % of photoinitiator 1-hydroxy-cyclohexyl-phenyl-ketone[2] and 1.0 w.t. % of photoinitiator 2,4,6-trimethylbenzoyl-diphenyl-phosphineoxide[2] was prepared using compressed air mixer. The mixture was then degassed using ~10$^{-1}$ torr vacuum to remove air bubbles before coating. A PET substrate[3] having a 7 mil thickness was blown with ionized air to clean the PET film. The mixture was coated onto the PET using a doctor blade to a wet thickness of 8.5 mil (~215 µm). A mask including the pattern of FIG. 6 was placed adjacent the substrate and a UV dosage of 55 mJ/cm$^2$ of ultraviolet light from a metal arc lamp having a collimation angle ~1.5° was used to illuminate the coating through the photomask. The UV exposed coating (with substrate) is then submerged in an agitated methanol bath for about 25 seconds to remove unpolymerized monomer. The substrate and the polymerized monomer are dried by blowing off any remaining solvent. Finally a post cure was performed by irradiating 609 mJ/cm$^2$ of UV dosage.

EXAMPLE 6

A mixture containing 13.4 w.t. % of monomer ethoxylated (6) trimethylolpropane triacrylate[1], 17.9 w.t. % of metallic acrylate ester oligomer[1], 40.6 w.t. % of Sartomer low viscosity oligomer[1], 17.9 w.t. % of urethane acrylate oligomer[1] and 8.9 w.t. % of difunctional amine coinitiator[1], 0.3 w.t. % of photoinitiator 1-hydroxy-cyclohexyl-phenyl-ketone[2] and 1.0 w.t. % of photoinitiator 2,4,6-trimethylbenzoyl-diphenyl-phosphineoxide[2] was prepared using compressed air mixer. The mixture was then degassed using ~10$^{-1}$ torr vacuum to remove air bubbles before coating. A PET substrate[3] having a 7 mil thickness was blown with ionized air to clean the PET film. The mixture was coated onto the PET using a doctor blade to a wet thickness of 8.5 mil (~215 µm). A mask including the pattern of FIG. 6 was placed adjacent the substrate and a UV dosage of 55 mJ/cm$^2$ of ultraviolet light from a metal arc lamp having a collimation angle ~1.5° was used to illuminate the coating through the photomask. The UV exposed coating (with substrate) is then submerged in an agitated methanol bath for about 25 seconds to remove unpolymerized monomer. The substrate and the polymerized monomer are dried by blowing off any remaining solvent. Finally a post cure was performed by irradiating 607 mJ/cm$^2$ of UV dosage.

[1] Suitable materials may be obtained from the Sartomer Company of Exton, Pa. [2]Suitable materials may be obtained from the Ciba Specialty Chemicals of Tarrytown, N.Y. [3]Suitable substrates may be obtained from Tekra of Orange, Calif.

The transmissive polymerizable material may be formed from a single material or may be formed from a mixture of two or more materials. The transmissive polymerizable material may include photopolymerizable material and non-photopolymerizable material. For example, the photopolymerizable material may be photopolymerizable monomers, dimmers or any other suitable material or combination of photopolymerizable materials while the non-photopolymerizable material may be selected from solids, solid particles, liquids, colloids, gases (e.g., air or nitrogen) or combinations of these materials. The transmissive polymerizable material may include one or more photoinitiators.

Although certain materials have been used in the above examples, it should be understood that any suitable materials may be used. Also, it should be understood that endless variations of large random masks and random cell masks may be created and that the mask examples are exemplary.

Although several embodiments of the present invention and its advantages have been described in detail, it should be understood that changes, substitutions, transformations, modifications, variations, permutations and alterations may be made therein without departing from the teachings of the present invention, the spirit and the scope of the invention being set forth by the appended claims.

What is claimed is:

1. A photomask comprising:
    a mask having a plurality of cell mask areas, the cell mask areas disposed in an XY matrix;
    wherein all of the cell mask areas have a substantially identical pattern of randomly placed transmissive apertures, and the photomask, viewed as a whole, appears macroscopically uniform and without an apparent grid pattern.

2. The photomask according to claim 1, wherein, within each of the plurality of cell mask areas, positions of the transmissive apertures in the substantially identical pattern of transmissive apertures correspond to a pattern of locations which are perturbed from a non-random pattern of locations at each location in a random direction and by a random distance where the random distance is no more than a maximum distance.

3. The photomask according to claim 1, wherein each of the transmissive apertures have a center, and the centers of the transmissive apertures of the substantially identical pattern of transmissive apertures are separated from each other by at least a minimum distance.

4. The photomask according to claim 3, wherein the minimum distance is selected such that adjacent transmissive apertures can overlap each other.

5. The photomask according to claim 3, wherein the minimum distance is selected such that adjacent transmissive apertures cannot overlap each other.

6. A method of fabricating a photomask comprising:
generating a plurality of cell mask areas, each cell mask area having transmissive apertures, all of the cell mask areas having a substantially identical pattern of randomly placed transmissive apertures;
positioning the generated cell mask areas in an XY matrix; and
forming the transmissive apertures patterns in the photomask;
wherein the photomask, viewed as a whole, appears macroscopically uniform and without an apparent grid pattern.

7. The method according to claim 6, wherein in the step of generating a plurality of cell mask areas, the transmissive apertures are generated from a non-random pattern of locations which are then perturbed at each location in a random direction and by a random distance where the random distance is no more than a maximum distance.

8. The method according to claim 6, wherein in the step of generating a plurality of cell mask areas, the transmissive apertures are positioned such that the transmissive apertures are separated from each other by at least a minimum distance.

9. The method according to claim 8, wherein the minimum distance is selected such that adjacent transmissive apertures can overlap each other.

10. The method according to claim 8, wherein the minimum distance is selected such that adjacent transmissive apertures cannot overlap each other.

11. The photomask according to claim 1, wherein, within each of the plurality of cell mask areas, positions of the transmissive apertures correspond to a random pattern of locations having centers with a minimum distance from each other and from apertures in adjacent cell mask areas and any opposing cell mask areas.

12. A method of fabricating a photomask comprising the steps of:
a) generating a cell mask area having a pattern of transmissive apertures randomly placed, each transmissive aperture having a center;
b) removing a transmissive aperture from the cell mask area if the transmissive aperture is spaced from adjacent transmissive apertures by less than a minimum amount;
c) removing a transmissive aperture from the cell mask area if the transmissive aperture is not spaced from transmissive apertures along opposing boundaries of the cell mask area by at least the minimum amount; and
d) forming the pattern of transmissive apertures in the photomask;
wherein the photomask, viewed as a whole, appears macroscopically uniform.

13. The method of claim 12, further comprising the steps of:
adding an additional randomly placed transmissive aperture to the cell mask area for each transmissive aperture removed in step b); and repeating step b).

14. The method of claim 13, further comprising the steps of:
adding an additional randomly placed transmissive aperture to the cell mask area for each transmissive aperture removed in step c); and
repeating step c).

15. A method of fabricating a photomask comprising the steps of:
a) generating a cell mask area having a pattern of transmissive apertures randomly placed, each transmissive aperture having a center;
b) removing a transmissive aperture from the cell mask area if the transmissive aperture is spaced from adjacent transmissive apertures by less than a minimum amount;
c) replicating the cell mask area and placing the replicated cell mask areas in an XY matrix;
d) removing a transmissive aperture from at least one cell mask area if the transmissive aperture is spaced from transmissive apertures in adjacent cell mask areas and opposing cell mask areas, if any, by less than the minimum amount; and
e) forming the pattern of transmissive apertures in the photomask;
wherein the photomask, viewed as a whole, appears macroscopically uniform.

16. The method of claim 15, further comprising the steps of:
adding an additional randomly placed transmissive aperture to the cell mask area for each transmissive aperture removed in step b); and
repeating step b).

17. The method of claim 16, further comprising the steps of:
adding an additional randomly placed transmissive aperture to the cell mask area for each transmissive aperture removed in step d); and
repeating step d).

18. The method of claim 15, further comprising the step of:
f) removing transmissive apertures in other cell mask areas corresponding to the transmissive aperture removed in step d).

19. The method of claim 18, further comprising the steps of:
adding an additional randomly placed transmissive aperture to the cell mask area having a transmissive aperture removed in step f);
replicating the added additional randomly placed transmissive aperture to the other cell mask areas having a transmissive aperture removed in step f); and
repeating steps d) and f).

* * * * *